United States Patent
Kitahara et al.

(10) Patent No.: US 10,276,416 B2
(45) Date of Patent: Apr. 30, 2019

(54) INDUSTRIAL ROBOT

(71) Applicant: NIDEC SANKYO CORPORATION, Suwa-gun, Nagano (JP)

(72) Inventors: Yasuyuki Kitahara, Nagano (JP); Shigeyuki Kaino, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 112 days.

(21) Appl. No.: 14/646,236

(22) PCT Filed: Aug. 6, 2014

(86) PCT No.: PCT/JP2014/070673
§ 371 (c)(1),
(2) Date: May 20, 2015

(87) PCT Pub. No.: WO2015/020071
PCT Pub. Date: Feb. 12, 2015

(65) Prior Publication Data
US 2016/0211160 A1 Jul. 21, 2016

(30) Foreign Application Priority Data
Aug. 8, 2013 (JP) .................................. 2013-165273

(51) Int. Cl.
*H01L 21/677* (2006.01)
*B25J 9/04* (2006.01)
*H01L 21/02* (2006.01)

(52) U.S. Cl.
CPC ........ *H01L 21/67742* (2013.01); *B25J 9/042* (2013.01); *H01L 21/02057* (2013.01); *H01L 21/67781* (2013.01)

(58) Field of Classification Search
CPC ......... H01L 21/67742; H01L 21/02057; H01L 21/67781; B25J 9/042
See application file for complete search history.

(56) References Cited

U.S. PATENT DOCUMENTS 6,132,160 A * 10/2000 Iwai .................. H01L 21/67781
414/222.01
6,146,083 A * 11/2000 Iwasaki ............. H01L 21/67742
414/744.3
(Continued)

FOREIGN PATENT DOCUMENTS

| JP | 10079410 A | 3/1998 |
| JP | 11011663 A | 1/1999 |

(Continued)

OTHER PUBLICATIONS

International Search Report corresponding to Application No. PCT/JP2014/070673; dated Nov. 11, 2014, with English translation.

*Primary Examiner* — Michael S Lowe
(74) *Attorney, Agent, or Firm* — Cantor Colburn LLP

(57) ABSTRACT

An industrial robot may include a first hand and a second hand, each of which is provided with a first hand portion including a substrate-mounting portion and a second hand portion having multiple substrate-mounting portions; a first arm rotatably joined to the first and second hand portion; a second arm rotatably joined to the first and second hand portion; an arm support portion; a column portion for holding said arm support portion; a first hand portion-rotating mechanism; a second hand portion-rotating mechanism; third hand portion-rotating mechanism; a fourth hand portion-rotating mechanism; a first arm-rotating mechanism structured to rotate said first arm with respect to said arm support portion; and a second arm-rotating mechanism structured to rotate said second arm with respect to said arm support portion.

8 Claims, 7 Drawing Sheets

(56) References Cited

U.S. PATENT DOCUMENTS

| | | | |
|---|---|---|---|
| 9,254,566 B2* | 2/2016 | Hashimoto | B25J 9/042 |
| 2006/0043750 A1* | 3/2006 | Wirth | H01L 21/67742 |
| | | | 294/103.1 |
| 2010/0150688 A1* | 6/2010 | Kitahara | H01L 21/68707 |
| | | | 414/226.02 |
| 2010/0290886 A1* | 11/2010 | Hashimoto | B25J 9/042 |
| | | | 414/800 |
| 2012/0321426 A1* | 12/2012 | Tanaka | H01L 21/67766 |
| | | | 414/728 |

FOREIGN PATENT DOCUMENTS

| | | | |
|---|---|---|---|
| JP | 2002507846 A | | 3/2002 |
| JP | 2002299408 A | | 10/2002 |
| JP | 2010052055 A | | 3/2010 |
| JP | 2010-69552 A | * | 4/2010 |
| JP | 2010069552 A | | 4/2010 |
| JP | 2010179419 A | | 8/2010 |
| WO | 2008065747 A1 | | 6/2008 |
| WO | 2010103876 A1 | | 9/2010 |

* cited by examiner

INDUSTRIAL ROBOT

CROSS REFERENCE TO PRIOR APPLICATIONS

This is the U.S. national stage of application No. PCT/JP2014/070673, filed on Aug. 6, 2014. Priority under 35 U.S.C. § 119(a) and 35 U.S.C. § 365(b) is claimed from Japanese Application No. 2013-165273, filed Aug. 8, 2013, the disclosures of which are incorporated herein by reference.

FIELD OF THE INVENTION

The present invention relates to an industrial robot that transfers substrates such as semiconductor wafers.

BACKGROUND

Conventionally known is an industrial robot that transfers substrates such as semiconductor wafers (Patent Reference 1, for example). The industrial robot disclosed in Patent Reference 1 is installed and used in a semiconductor manufacturing system, for example. This industrial robot is equipped with a substrate-mounting mechanism on which multiple substrates are to be mounted, an arm that rotatably supports the base end of the substrate-mounting mechanism, a revolving mechanism that rotatably supports the base end of the arm, and a main body section that supports the revolving mechanism to move in the up-down direction. The substrate-mounting mechanism has five hand forks which are arranged to overlap with each other at a predetermined pitch in the up-and-down direction; in this industrial robot, five substrates can be simultaneously mounted in the substrate-mounting mechanism. Therefore, this industrial robot is capable of transferring five substrates at the same time.

PATENT REFERENCE

[Patent Reference 1] Unexamined Japanese Patent Application 2010-179419 Publication As mentioned above, the industrial robot disclosed in Patent Reference 1 can transfer five substrates simultaneously; therefore, a semiconductor manufacturing system in which this industrial robot is installed can increase productivity. On the other hand, there is also a need to transfer substrates one by one. However, it is difficult for the industrial robot disclosed in Patent Reference 1 to transfer only one substrate at a time.

Also, substrate-cleaning may be performed in a semiconductor manufacturing system; therefore, the industrial robot may be used to transfer pre-cleaned substrates into a cleansing device or transfer the cleaned substrate from the cleaning device. At that time, any dust or the like that was attached to the pre-cleaned substrate may become attached to the hand forks on which the substrates are mounted. For this reason, if the cleaned substrate is mounted on the hand forks on which the pre-cleaned substrates were mounted before, the cleaned substrates may become contaminated again. Therefore, it is preferred that the clean substrates be mounted on hand forks different from the ones on which the pre-cleaned substrates are mounted. However, the industrial robot disclosed in Patent Reference 1 is provided with five hand forks in the single substrate-mounting mechanism; therefore, it is difficult to mount the clean substrates in the substrate-mounting mechanism which is different from the one used to mount the pre-cleaned substrates.

SUMMARY

At least an embodiment of the present invention provides an industrial robot capable of changing the number of substrates to transfer simultaneously. At least an embodiment of the present invention provides an industrial robot which can be manufactured in a simplified configuration and in which processed substrates can be mounted on a hand different from the one used to mount unprocessed substrates.

To achieve the above objectives, the industrial robot of at least an embodiment of the present invention comprises a first hand and a second hand, each of which is provided with a first hand portion having a single substrate-mounting portion to mount one substrate and a second hand portion having multiple substrate-mounting portions arranged to overlap with each other at a predetermined pitch, a first arm to which the first hand portion and the second hand portion of the first hand are rotatably joined to the front end thereof, a second arm to which the first hand portion and the second hand portion of the second hand are rotatably joined to the front end thereof, an arm support portion to which the base side of the first arm and the base side of the second arm are rotatably joined, a column portion supporting the arm support portion to move in the up-down direction, a first hand portion-rotating mechanism which rotates the first hand portion of the first hand with respect to the first arm, a second hand portion-rotating mechanism which rotates the second hand portion of the first hand with respect to the first arm, a third hand portion-rotating mechanism which rotates the first hand portion of the second hand with respect to the second arm, a fourth hand portion-rotating mechanism which rotates the second hand portion of the second hand with respect to the second arm, a first arm-rotating mechanism which rotates the first arm with respect to the arm support portion, and a second arm-rotating mechanism which rotates the second arm with respect to the arm support portion; the first hand portion and the second hand portion of the first hand are arranged such that they overlap with each other in the up-down direction and the center of rotation of the first hand portion of the first hand aligns with the center of rotation of the second hand portion of the first hand, the first hand portion and the second hand portion of the second hand are arranged such that they overlap with each other in the up-down direction and the center of rotation of the first hand portion aligns with the center of rotation of the second hand portion; the first arm is attached to the top surface of the arm support portion while the second arm is attached to the bottom surface of the arm support portion; the first arm and the second arm are arranged such that the center of rotation of the first arm aligns with the center of rotation of the second arm.

In the industrial robot of at least an embodiment of the present invention, the first hand is equipped with the first hand portion having one substrate-mounting portion and the second hand portion having multiple substrate-mounting portions, and the first hand portion and the second hand portion are rotatably joined to the first arm. The industrial robot of at least an embodiment of the present invention is also equipped with the first hand portion-rotating mechanism to rotate the first hand portion of the first hand with respect to the first arm and the second hand portion-rotating mechanism to rotate the second hand portion of the first hand with respect to the first arm; the first and second hand portions of the first hand are arranged such that they overlap with each other in the up-down direction and the center of rotation of the first hand portion of the first hand aligns with the center of rotation of the second hand portion of the first hand. In the same manner, the second hand of at least an embodiment of the present invention is equipped with the first hand portion having one substrate-mounting portion and the second hand portion having multiple substrate-mounting portions, and these first and second hand portions are rotatably joined to the second arm. Also, the industrial robot of at least an embodiment of the present invention is equipped with a third hand portion-rotating mechanism to rotate the first hand portion of the second hand with respect to the second arm and a fourth hand portion-rotating mechanism to rotate the second hand portion of the second hand with respect to the second arm; the first and second hand portions of the second hand are arranged such that they overlap with each other in the up-down direction and the center of rotation of the first hand portion of the second hand aligns with the center of rotation of the second hand portion of the second hand.

Therefore, in at least an embodiment of the present invention, the substrate-mounting portion of the first hand portion can be overlapped with the substrate-mounting portions of the second hand portion so that substrates can be mounted on both the first hand portion and the second hand portion, or the substrate-mounting portion of the first hand portion may be shifted from the substrate-mounting portions of the second hand portion so that the substrates may be mounted only on the substrate-mounting portions of the second hand portion. Thus, in at least an embodiment of the present invention, the number of substrates that need to be simultaneously transferred can be changed.

Further, the industrial robot of at least an embodiment of the present invention is equipped with the first hand, the second hand, the first arm to which the first hand is rotatably joined, the second arm to which the second hand is rotatably joined, the first arm-rotating mechanism for rotating the first arm with respect to the arm support portion and the second arm-rotating mechanism for rotating the second arm with respect to the arm support portion; therefore, the first hand and the second hand can independently be operated. Therefore, at least an embodiment of the present invention makes it possible to mount unprocessed substrates on the first hand and mount the processed substrates on the second hand; as a result, the processed substrates can be mounted on the hand different from the one on which the unprocessed substrates were placed. Also, in at least an embodiment of the present invention, the first and second arms are joined to the common arm support portion; therefore, the configuration of the industrial robot can be simplified compared to the configuration in which the arm support portion in which the base end of the first arm is rotatably joined is provided separately from the arm support portion to which the base end of the second arm is rotatably joined. Thus, in at least an embodiment of the present invention, while the processed substrates can be mounted on the hand different from the hand on which the unprocessed substrates are mounted, the configuration of the industrial robot can be simplified.

In at least an embodiment of the present invention, it is preferred that the industrial robot be provided with a horizontally-moving mechanism which moves the column portion in the horizontal direction. With this configuration, substrates can be transferred in a wider range by the industrial robot.

In at least an embodiment of the present invention, a first hand portion-driving motor which is a component of the first hand portion-rotating mechanism and a second hand portion-driving motor which is a component of the second hand portion-rotating mechanism are arranged inside the first arm, and a third hand portion-driving motor which is a component of the third hand portion-rotating mechanism and a fourth hand portion-driving motor which is a component of the fourth hand portion-driving mechanism are arranged inside the second arm. In the preset invention, the first arm-driving motor which is a component of the first arm-rotating mechanism and the second arm-driving motor which is a component of the second arm-rotating mechanism are arranged inside the arm support portion, for example.

In at least an embodiment of the present invention, it is preferred that unprocessed substrates be mounted on the first and second hand portions of the first hand and the processed substrates be mounted on the first and second hand portions of the second hand. In at least an embodiment of the present invention, the process is a cleaning process for cleaning substrates, for example. In this case, pre-cleaned substrates are mounted in the first hand and the cleaned substrates are mounted on the second hand; therefore, the clean substrates are kept from getting contaminated again.

As described above, the number of the substrates that are transferred simultaneously can be changed in the industrial robot of at least an embodiment of the present invention. Also, the industrial robot of at least an embodiment of the present invention can mount the cleaned substrates on the hand which is different from the one on which the pre-cleaned substrates are mounted, while the configuration of the robot is simplified.

BRIEF DESCRIPTION OF DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
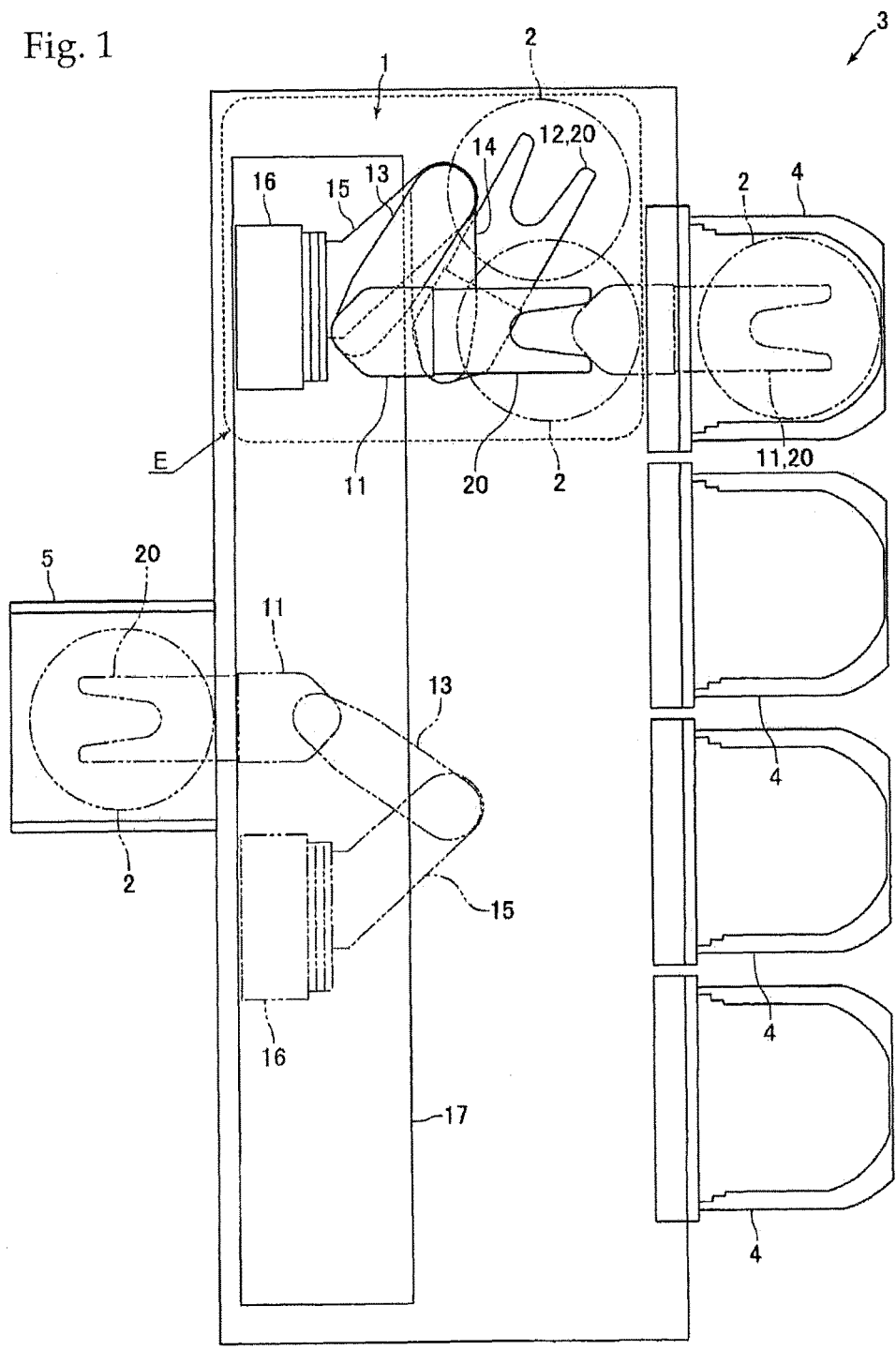
FIG. 1 A plan view of an industrial robot of an embodiment of the present invention, installed in a semiconductor manufacturing system.

At least an embodiment of the present invention is described hereinafter referring to the drawings.

(Configuration of Industrial Robot)

Figure 2:
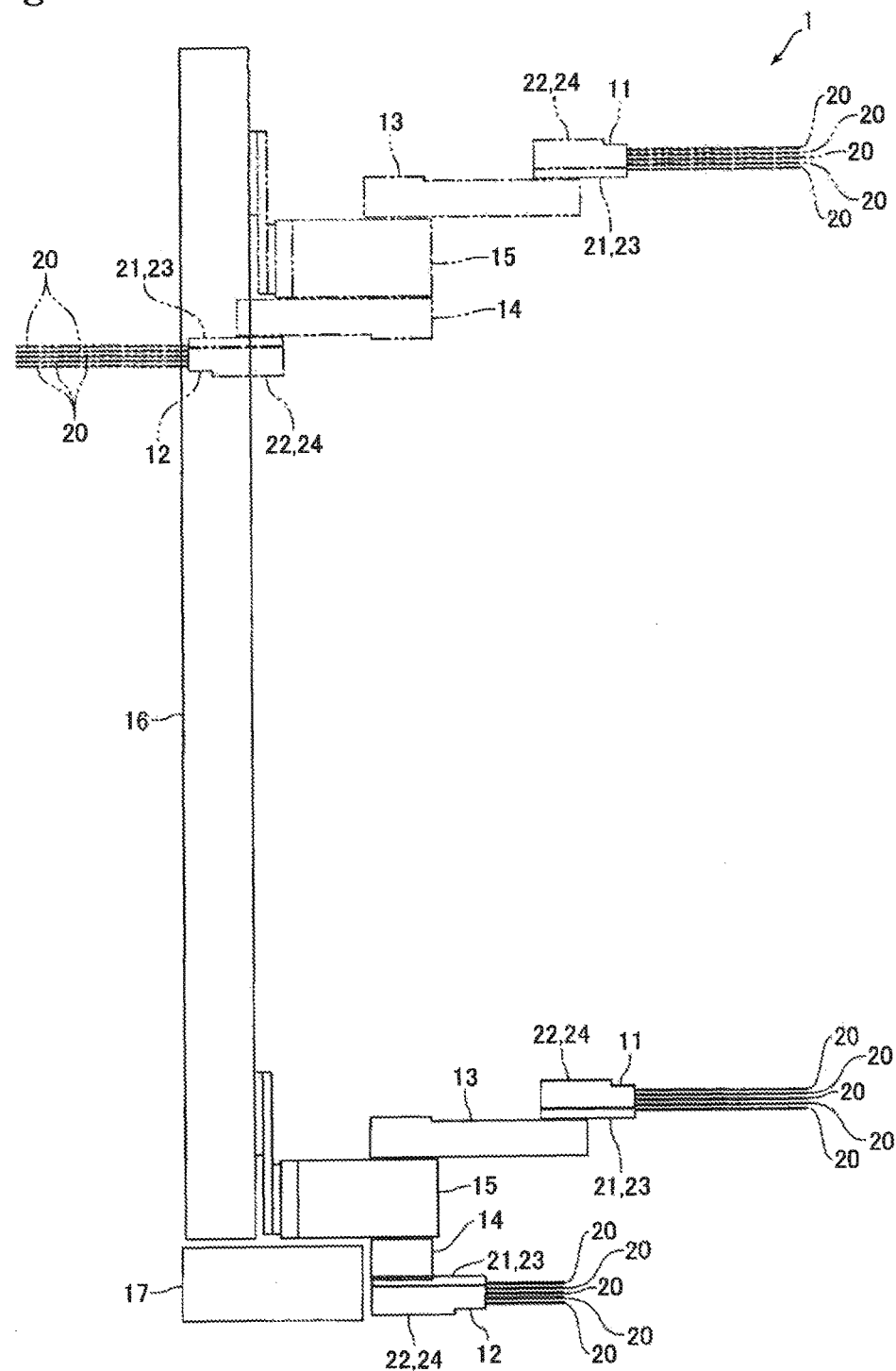
FIG. 2 A side view of the industrial robot of FIG. 1.
Figure 3:
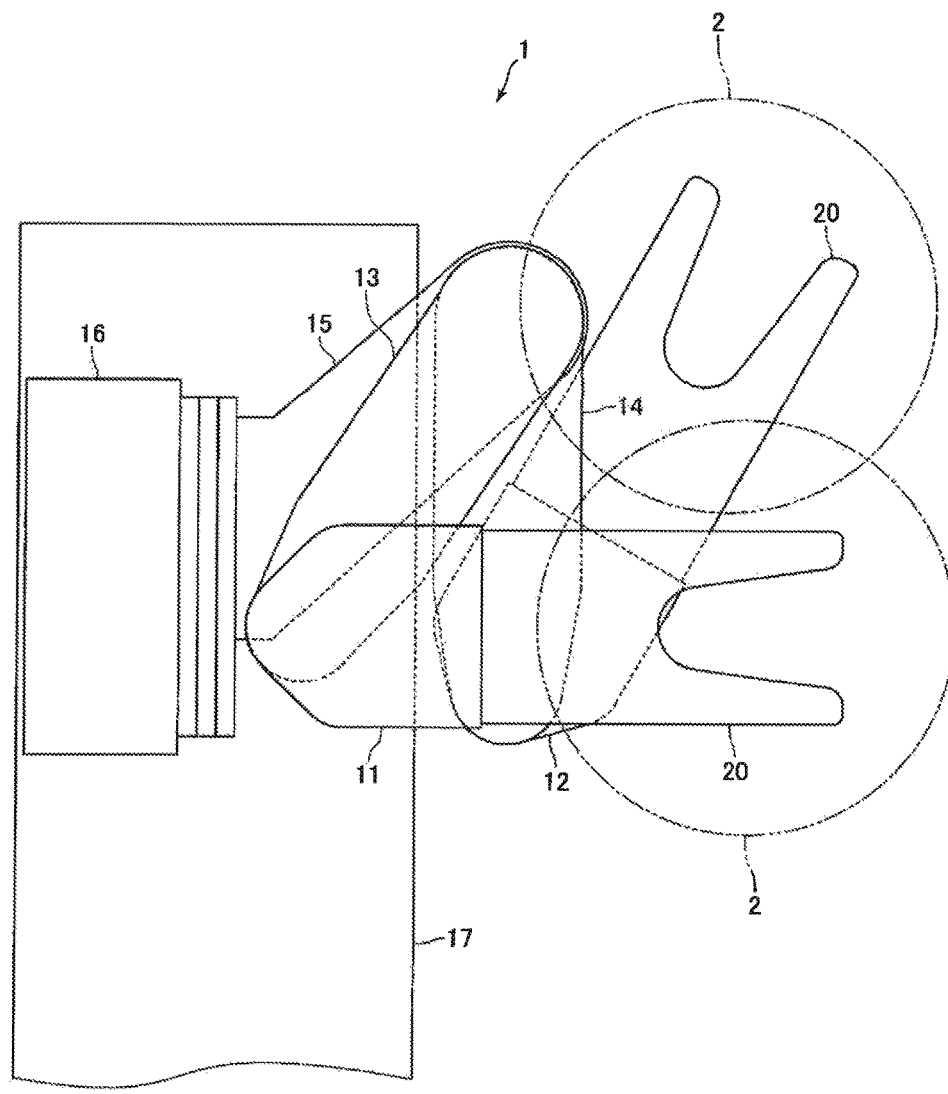
FIG. 3 An enlarged view of the E section of FIG. 1.
Figure 4:
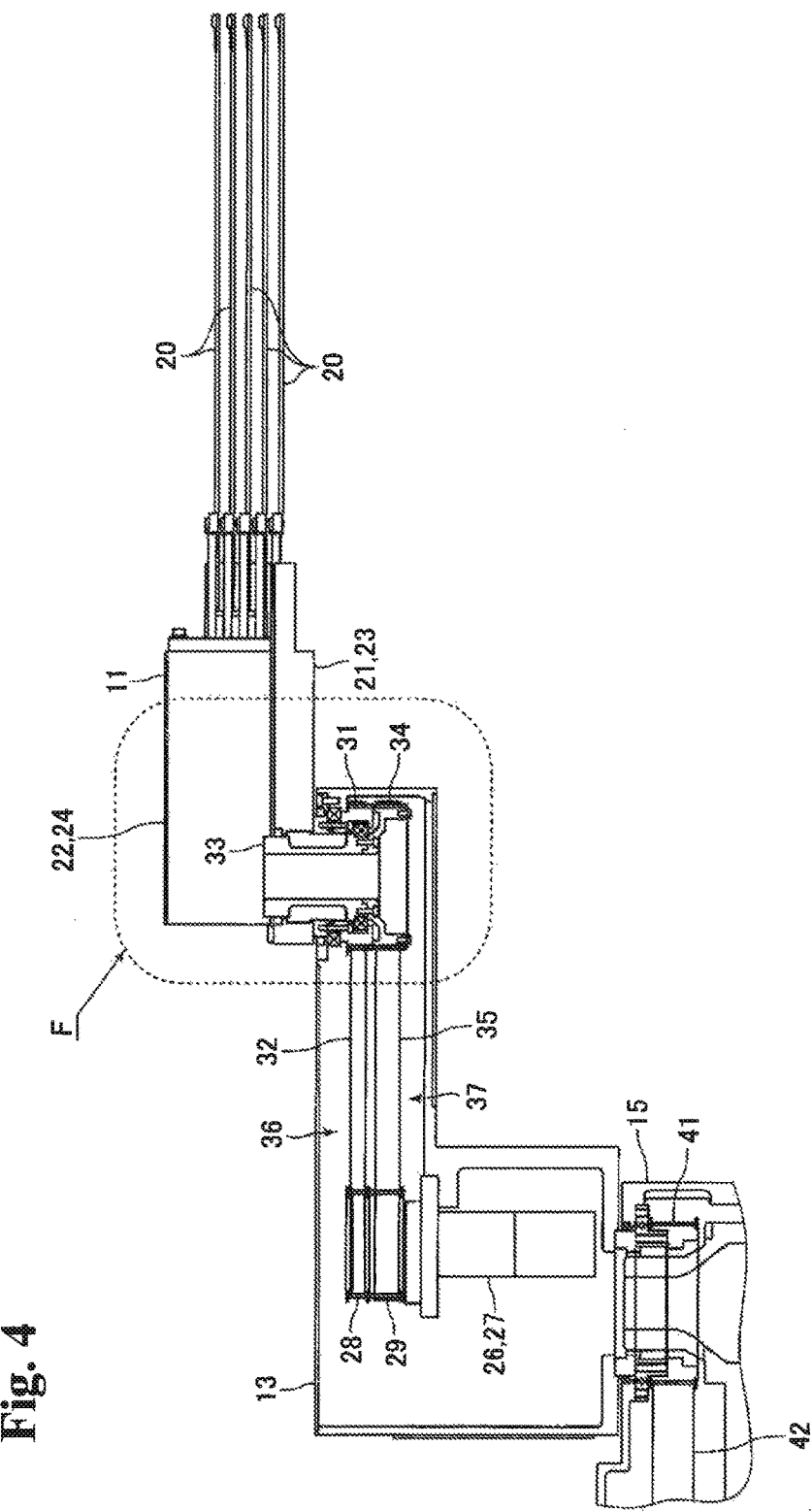
FIG. 4 A diagram to explain the joining portion between the first hand and the arm and the joining portion between the first arm and the arm support portion shown in FIG. 2.
Figure 5:
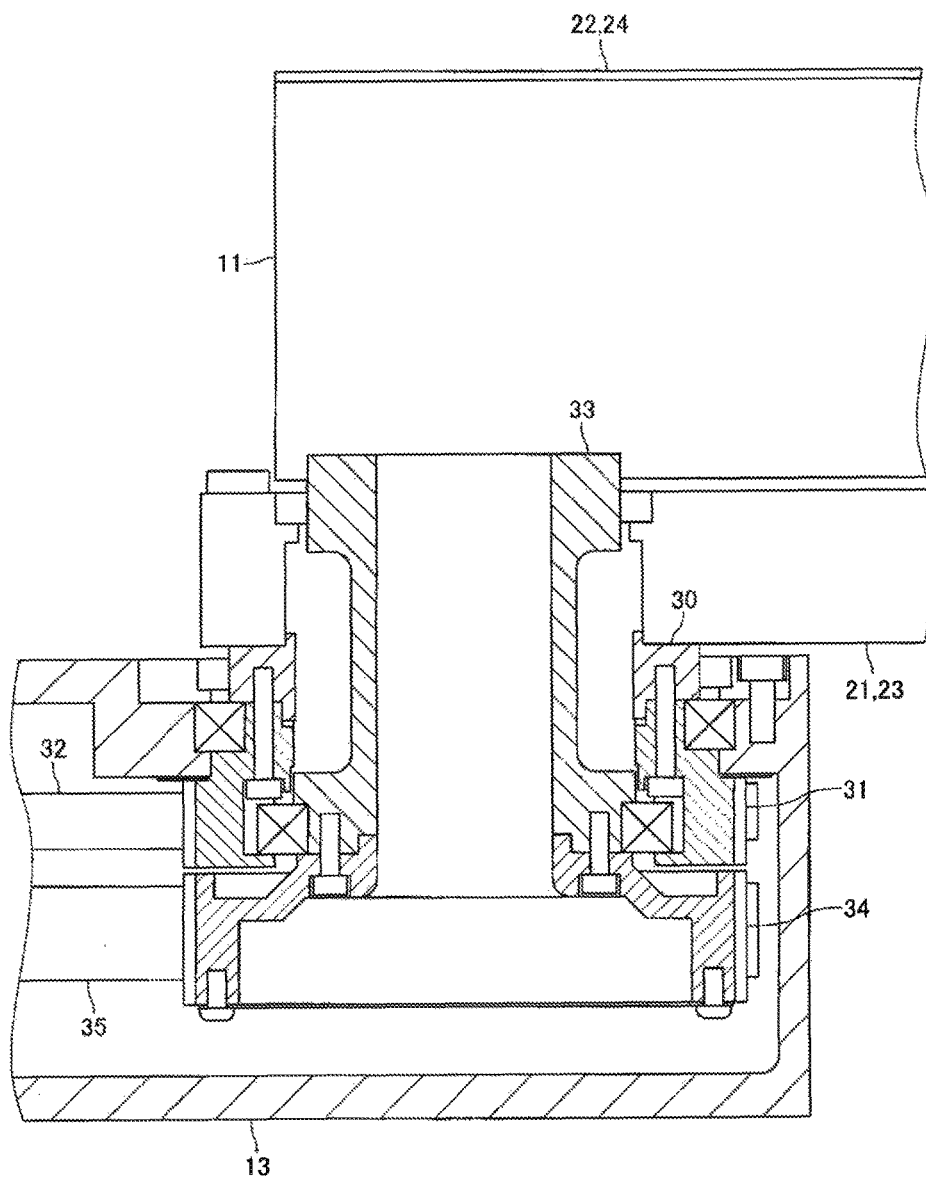
FIG. 5 An enlarged view of the F section of FIG. 4.
Figure 6:
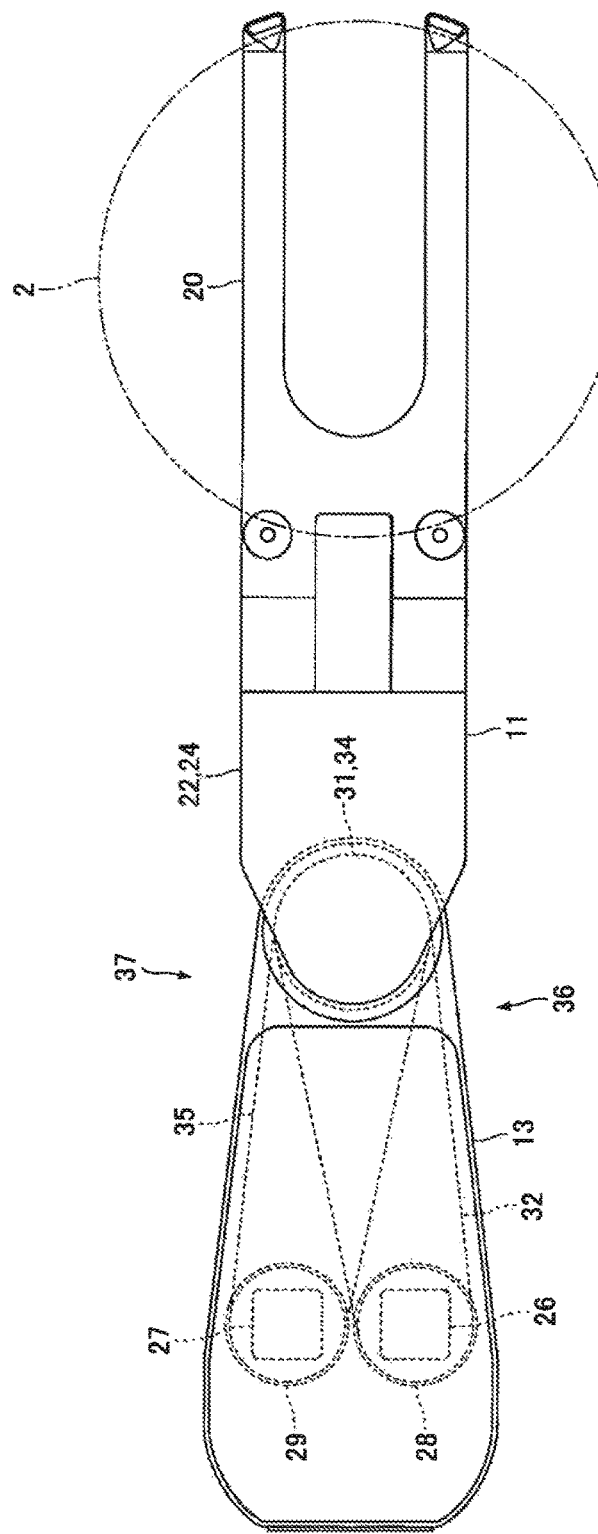
FIG. 6 A plan view of the first hand and the first arm shown in FIG. 4.

FIG. 1 is a plan view of an industrial robot 1 of an embodiment of the present invention, installed in a semiconductor manufacturing system 3. FIG. 2 is a side view of the industrial robot 1 shown in FIG. 1. FIG. 3 is an enlarged view of the E section of FIG. 1. FIG. 4 is a diagram to explain the joining portion between a first hand 11 and a first arm 13 and the joining portion between the first arm 13 and the arm support portion 15 shown in FIG. 2. FIG. 5 is an enlarged view of the F section of FIG. 4. FIG. 6 is a plan view of the first hand 11 and the first arm 13 shown in FIG.

Figure 7:
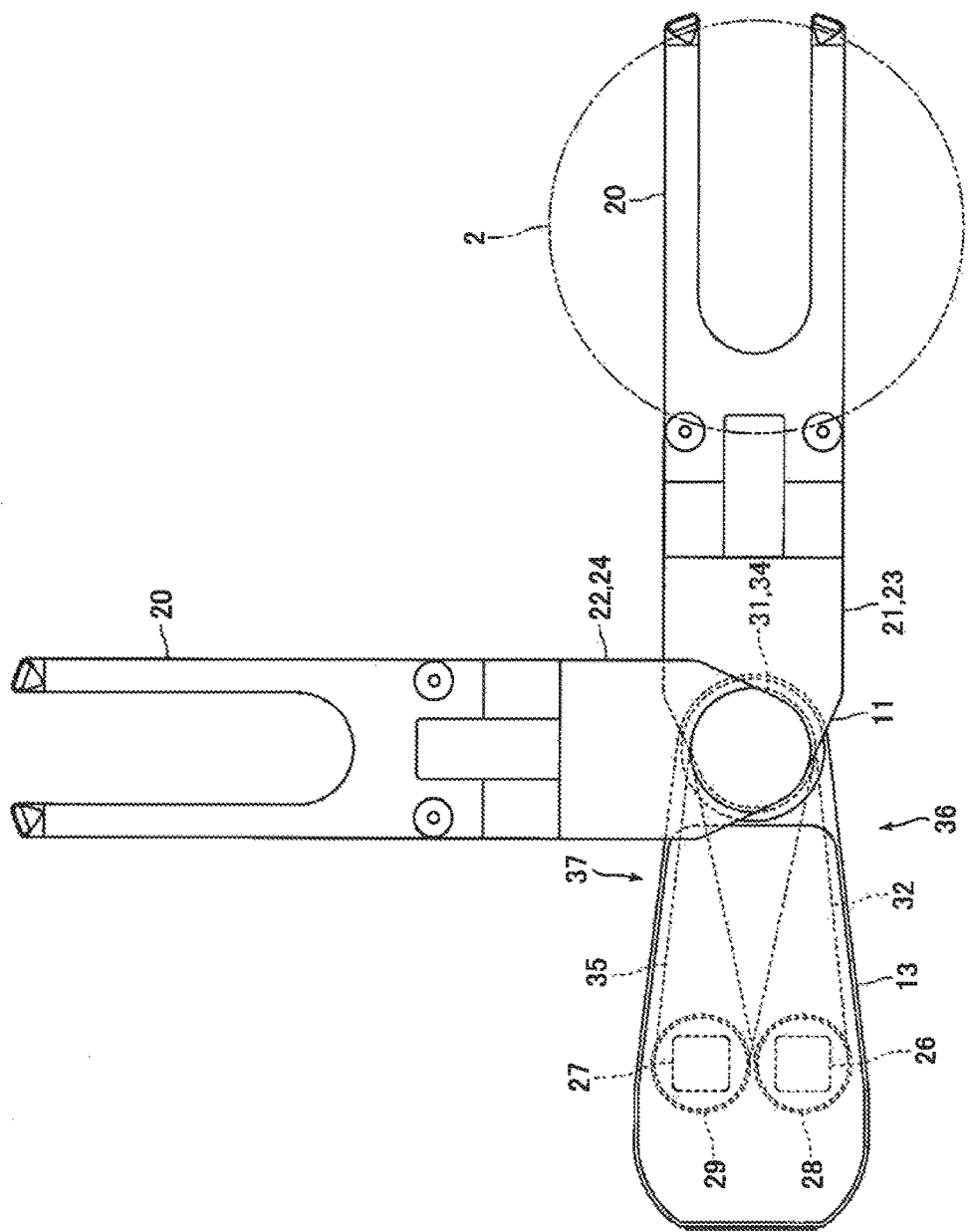
FIG. 7 A plan view of the first hand shown in FIG. 4 when transferring one semiconductor wafer.

4. FIG. 7 is a plan view of the first hand 11 shown in FIG. 4 when transferring one semiconductor wafer 2.

The industrial robot of at least an embodiment of the present invention (hereinafter denoted as "robot 1") is a robot that transfers semiconductors (hereinafter denoted as "wafers 2") as substrates. The robot 1 is installed in the semiconductor manufacturing system 3 for use, as shown in FIG. 1, and transfers the wafers 2 between a cassette 4 and a transfer stage 5. In the cassette 4, several wafers 2 are stored being stacked up at a predetermined pitch. In the manufacturing system 3, multiple cassettes 4 can be installed. The transfer stage 5 stores the wafers 2 which are to be transferred to a processor (not illustrated) in which a predetermined process is performed or the wafers 2 which are transferred from the processor. In the transfer stage 5, multiple wafers 2 are stored being stacked up at a predetermined pitch. Note that in FIG. 1 one transfer stage 5 is provided in the manufacturing system 3; however, two or more transfer stages 5 may be provided in the manufacturing system 5.

The robot 1 is equipped with two hands, the first hand 11 and the second hand 12, on which wafers 2 are to be mounted, the first arm 13 which the first hand is rotatably joined to the front end thereof, the second arm 14 which the second hand 12 is rotatably joined to the front end thereof, the arm support portion 15 which the base end of the first arm 13 and the base end of the second arm 14 are rotatably joined, and a column portion 16 which holds the arm support portion 15 to move in the up-down direction. The robot 1 is also equipped with a horizontally-moving mechanism 17 which moves the column portion 16 in the horizontal direction.

The first hand 11 is attached to the top surface of the first arm 13 and positioned above the first arm 13. The second hand 12 is attached to the bottom surface of the second arm 14 and positioned below the second arm 14. The first arm 13 is attached to the top surface of the arm support portion 15 and positioned above the arm support portion 15. The second arm 14 is attached to the bottom surface of the arm support portion 15 and positioned below the arm support portion 15. The first arm 13 and the second arm 14 are arranged such that the center of rotation of the first arm 13 with respect to the arm support portion 15 aligns with the center of rotation of the second arm 14.

The first hand 11 is provided with a first hand portion 21 having one hand fork 20 as a substrate-mounting portion on which one piece of wafer 2 is to be mounted, and a second hand portion 22 having multiple hand forks 20 which are arranged to overlap with each other in the up-down direction at a predetermined pitch. The second hand portion 22 of this embodiment is provided with four hand forks 20. The first hand portion 21 and the second hand portion 22 are rotatably joined to the front end of the first arm 13. As described above, the first hand 11 is positioned above the first arm 13. In other words, the first hand portion 21 and the second hand portion 22 of the first hand 11 are both positioned above the first arm 13.

The hand fork 20 is formed in a U-shape. The first hand portion 21 is provided with a fork holding portion 23 to which one hand fork 20 is fixed. The second hand portion 22 is provided with a fork holding portion 24 to which four hand forks 20 are fixed. The fork holding portions 23 and 24 are formed to have the same shape when viewed in the up-down direction.

The first hand portion 21 and the second hand portion 22 are arranged such that the center of rotation of the first hand portion 21 with respect to the first arm 13 aligns with the center of rotation of the second hand portion 22 with respect to the first arm 13. Also, the first hand portion 21 and the second hand portion 22 are arranged to overlap with each other in the up-down direction. In this embodiment, the first hand portion 21 is positioned below the second hand portion 22. The pitch between the hand fork 20 of the second hand portion 22 positioned at the bottom and the hand fork 20 of the first hand portion 21 in the up-down direction is equal to the pitch between the four hand forks 20 of the second hand portion 22 in the up-down direction.

The first arm 13 is formed hollow. Arranged inside the first arm 13 are a motor 26 for rotating the first hand portion 21 with respect to the first arm 13 and a motor 27 for rotating the second hand portion 22 with respect to the first arm 13. The motors 26 and 27 are arranged such that the axial directions of their output shafts are parallel to the up-down direction. A pulley 28 is fixed to the output shaft of the motor 26, and a pulley 29 is fixed to the output shaft of the motor 27. The pulley 28 is positioned above the pulley 29. The motor 26 of this embodiment is the first hand portion-driving motor and the motor 27 is the second hand portion-driving motor.

As shown in FIG. 5, the top end face of a disk-like pulley-holding member 30 is fixed to the bottom surface of the base end of the first hand portion 21 (i.e., the bottom surface on the base end of the fork-holding portion 23). A pulley 31 is fixed to the bottom end surface of the pulley-holding member 30. The pulley-holding members 30 and 31 are rotatably held at the front end of the first arm 13. A belt 32 is wound between the pulley 28 and the pulley 31.

As shown in FIG. 5, the top end face of a disk-like pulley-holding member 33 is fixed to the bottom surface of the base end of the second hand portion 22 (i.e., the bottom surface of the base end of the fork holding portion 24). The bottom side of the pulley holding member 33 is positioned in the inner circumferential side of the pulley-holding portion 30 and the pulley 31. A pulley 34 is fixed to the bottom end surface of the pulley-holding member 33. The pulley-holding member 33 and the pulley 34 are rotatably held by the pulley 31. A belt 35 is wound between the pulley 29 and the pulley 34.

In this embodiment, the first hand portion-rotating mechanism 36 which rotates the first hand portion 21 with respect to the first arm 13 is configured by the motor 26, the pulleys 28 and 31, the belt 32 and the pulley-holding member 30. Also, the second hand portion-driving mechanism 37 which rotates the second hand portion 22 with respect to the first arm 13 is configured by the motor 27, the pulleys 29 and 34, the belt 35 and the pulley-holding member 33.

The second hand 12 is formed in the up-down inverse configuration of the components of the first hand 11. In other words, the second hand 12 is provided with the first hand portion 21 and the second hand portion 22 positioned below the first hand portion 21. The first and second hand portions 21 and 22 of the second hand 12 are positioned below the second arm 14 and rotatably joined to the front end of the second arm 14. Also, the first and second hand portions 21 and 22 of the second hand 12 are arranged such that they overlap with one another in the up-down direction and the center of rotation of the first hand portion 21 with respect to the second arm 14 aligns with the center of rotation of the second hand portion 22 with respect to the second arm 14.

The second arm 14 is formed in the upside-down inverse configuration of the components of the first arm 13. The robot 1 is also equipped with a third hand portion-rotating mechanism (no illustration) which rotates the first hand portion 21 of the second hand 12 with respect to the second arm 14 and a fourth hand portion-driving mechanism (no illustration) which rotates the second hand portion 22 of the second hand 12 with respect to the second arm 14. The third hand portion-rotating mechanism is formed in the upside-down inverse configuration of the components of the first hand portion-rotating mechanism 36 upside down, and is equipped with the third hand portion-driving motor for driving the first and portion 21 of the second hand 12 with respect to the second arm 14. Also, the fourth hand portion-rotating mechanism is formed in the upside-down inverse configuration of the components of the second hand portion-rotating mechanism 37, and is equipped with the fourth hand portion-driving motor for rotating the second hand portion 22 of the second hand 12 with respect to the second arm 14. The third hand portion-driving motor and the fourth hand portion-driving motor are arranged inside the second arm 14 which is hollow.

The arm support portion 15 is formed hollow. Arranged inside the arm support portion 15 is the first arm-driving motor (no illustration) for driving the first arm 13 with respect to the arm support portion 15. As shown in FIG. 4, a pulley 41 is fixed to the bottom surface of the base end of the first arm 13 via a predetermined member. The pulley 41 is rotatably held by the arm support portion 15. Between the pulley fixed to the output shaft of the first arm-driving motor and the pulley 41, the belt 42 is wound. In this embodiment, the first arm-driving mechanism for rotating the first arm 13 with respect to the arm support portion 15 is configured by the first arm-driving motor, the pulley 41 and the belt 42.

Further, the robot 1 is equipped with a second arm-driving mechanism (no illustration) for driving the second arm 14 with respect to the arm support portion 15. The second arm-driving mechanism is formed in the upside-down inverse configuration of the components of the first arm-rotating mechanism, and is equipped with the second arm-driving motor for rotating the second arm 14 with respect to the arm support portion 15. The second-driving motor is arranged inside the arm support portion 15 which is hollow.

The column portion 16 is formed to be long in the up-down direction. A guide portion (no illustration) is formed at the column portion 15 for guiding the arm support portion 15 in the up-down direction. Also, the robot 1 is equipped with an up-down driving mechanism (no illustration) for moving the arm support portion 15 up and down along the column portion 16, and the arm support portion 15 is formed movable in the up-down direction.

The horizontally-moving mechanism 17 is equipped with a fixing member (no illustration) to which the bottom end of the column portion 16 is fixed, a guide portion (no illustration) for guiding the fixing member in the horizontal direction. As shown in FIG. 1, the horizontally-moving mechanism 17 moves the column portion 16 in the direction of the arrangement of multiple cassettes 4 which are arranged in a predetermined direction.

In the robot 1 configured as above, the first hand 11 transfers the wafers 2 between the cassettes 4 and the transfer stage 5 by combining the use of the rotation of the first hand 11, the rotation of the first arm 13, the up-down movement of the arm support portion 15 and the horizontal movement of the column portion 16. Also, the second hand 12 transfers the wafers 2 between the cassettes 4 and the transfer stage 5 by combining the use of the rotation of the second hand 12, the rotation of the second arm 14, the up-down movement of the arm support portion 15 and the horizontal movement of the column portion 16.

In this embodiment, five wafers 2 can simultaneously be transferred or only one wafer 2 can be transferred by the first hand 11 and the second hand 12. When transferring five wafers 2 simultaneously, as shown in FIG. 6, the robot 1 is operated keeping the hand fork 20 of the first hand portion 21 and the four hand forks 20 of the second hand portion 22 overlapped with each other in the up-down direction. Thus, five wafers 2 are transferred by one hand fork 20 of the first hand portion 21 and four hand forks 20 of the second hand portion 22. On the other hand, as shown in FIG. 7, when transferring only one wafer 2, the robot 1 is operated keeping the hand fork 20 of the first hand portion 21 shifted from the four hand forks 20 of the second hand portion 22. Thus, only one wafer 2 is transferred by one hand fork 20 of the first hand portion 21.

In this embodiment, also, pre-processed wafers 2 are transferred by the first hand 11, and the processed wafers 2 are transferred by the second hand 12. In other words, wafers 2 which are not given a predetermined process are mounted on the first hand portion 21 and the second hand portion 22 of the first hand 11, and the wafers 2 which are given the process are mounted on the first hand portion 21 and the second hand portion 22 of the second hand 12. More specifically described, wafers 2 before the cleaning are mounted on the first hand portion 21 and the second hand portion 22 of the first hand 11; the wafers 22 after the cleaning are mounted on the first hand portion 21 and the second hand portion 22 of the second hand 12.

Note that pre-processed wafers 2 may be mounted on the first hand portion 21 and the second hand portion 22 of the second hand 12 while the processed wafers 2 may be mounted on the first hand portion 21 and the second hand portion 22 of the first hand 11. In other words, wafers 2 which are not cleaned yet can be mounted on the first hand portion 21 and the second hand portion 22 of the second hand 12, and the wafers 2 which are cleaned can be mounted on the first hand portion 21 and the second hand portion 22 of the first hand 11. In the transfer stage 5, the portion to mount pre-processed wafers 2 and the portion to mount the processed wafers 2 are demarcated.

(Major Effects of this Embodiment)

In this embodiment, as described above, the first hand 11 is equipped with the first hand portion 21 having one hand fork 20 and the second hand portion 22 having four hand forks 20, and is rotatably joined to the first arm 13. In this embodiment, also, the first hand portion 21 and the second hand portion 22 of the first hand 11 are arranged such that they overlap with each other in the up-down direction and the center of rotation of the first hand portion 21 with respect to the first arm 13 and center of rotation of the second hand portion 22 with respect to the first arm 13 align with each other. Further, the robot 1 of this embodiment is equipped with the first hand portion-rotating mechanism 36, which rotates the first hand portion 21 of the first hand 11 with respect to the first arm 13, and the second hand portion-rotating mechanism 37, which rotates the second hand portion 22 of the first hand 11 with respect to the first arm 13.

In the same manner, in this embodiment, the second hand 12 is equipped with the first hand portion 21 and the second hand portion 22, and is rotatably joined to the second arm 14. In this embodiment, the first hand portion 21 and the second hand portion 22 of the second hand 12 are arranged such that they overlap with each other in the up-down direction and the center of rotation of the first hand portion 21 with respect to the second arm 14 aligns with the center of rotation of the first hand portion 21 with respect to the second arm 14. Further, the robot 1 of this embodiment is equipped with the third hand portion-rotating mechanism, which rotates the first hand portion 21 of the second hand 12 with respect to the second arm 14, and the fourth hand portion-rotating mechanism, which rotates the second hand portion 22 of the second hand 12 with respect to the second arm 14.

Therefore, in this embodiment, when the robot 1 is operated keeping the hand fork 20 of the first hand portion 21 and the four hand forks 20 of the second hand portion 22 overlapped in the up-down direction as described above, five wafers 2 can simultaneously be transferred. Also, in this embodiment, when the robot 1 is operated having the hand fork 20 of the first hand portion 21 shifted from the four hand forks 20 of the second hand portion 22, only one wafer 2 may be transferred. In other words, the number of wafers 2 to transfer can be changed in this embodiment.

In this embodiment, the robot 1 is equipped with the first hand 11, the second hand 12, the first arm 13 to which the first hand 11 is rotatably joined, the second arm 14 to which the second hand 12 is rotatably joined, the first arm-rotating mechanism for rotating the first arm 13 with respect to the arm support portion 15, and the second arm-rotating mechanism for rotating the second arm 14 with respect to the arm support portion 15. Therefore, in this embodiment, pre-processed wafers 2 can be mounted on the first hand portion 21 and the second hand portion 22 of the first hand 11 and the processed wafers 2 can be mounted on the first hand portion 21 and second hand portion 22 of the second hand, as described above. For example, pre-cleaned wafers 2 can be mounted on the first hand portion 21 and the second hand portion 22 of the first hand 11, and the cleaned wafers 2 can be mounted on the first hand portion 21 and the second hand portion 22 of the second hand 12. In this embodiment, consequently, the cleaned wafer 2 are prevented from getting contaminated again.

Also, the first arm 13 and the second arm 14 are attached to the common arm support portion 15 in this embodiment; therefore, the configuration of the robot 1 can be simplified compared to the one in which the arm support portion to which the base end of the first arm 13 is rotatably joined is provided separately from the arm support portion to which the base end of the second arm 14 is rotatably joined. In other words, the processed wafers 2 can be mounted on the second hand 12 which is different from the first hand that mounted the pre-processed wafers in this embodiment while the configuration of the robot 1 is simplified.

OTHER EMBODIMENTS

The above described embodiment is an example of preferred embodiment of the present invention; however, the present invention is not limited to this, but can be varyingly modified within the scope of the invention.

In the above-described embodiment, pre-cleaned wafers 2 are mounted on the first hand portion 21 and the second hand portion 22 of the first hand 11 while the cleaned wafers are mounted on the first hand portion 21 and the second hand portion 22 of the second hand 12. Beside this, low-temperature wafers 2 prior to a heat treatment may be mounted on the first hand portion 21 and the second hand portion 22 of the first hand 11 while the high-temperature wafers 2 after the heat treatment may be mounted on the first hand portion 21 and the second hand portion 22 of the second hand 12. In this case, the first hand portion 21 and the second hand portion 22 of the second hand 12 need to be formed of a heat-resistant material while the first hand portion 21 and the first hand portion 11 do not need to be formed of a heat-resistant material. Therefore, the cost of the robot 1 can be reduced.

In the above-described embodiment, the robot 1 is operated keeping the hand fork 20 of the first hand portion 21 shifted from the four hand forks 20 of the second hand portion 22, to transfer only one wafer 2 by the single hand fork 20 of the first hand portion 21. Beside this, the robot 1 may be operated keeping the hand fork 20 of the first hand portion 21 shifted from the four hand forks 20 of the second hand portion 22, to transfer the four wafers 2 by the four hand forks 20 of the second hand portion 22.

In the above-described embodiment, the second hand portion 22 is equipped with the four hand forks 20. Beside this, the number of the hand forks 20 of the second hand portion 22 may be two, three or even five or more. In the above-described embodiment, also, the first arm 13 and the second arm 14 are not equipped with a joining section; however, they may be equipped with one. In other words, the first arm 13 and the second arm 14 may be configured by multiple arm portions which are joined together via joining sections.

In the above-described embodiment, the arm support portion 15 may be rotatable with respect to the column portion 16 having the up-down direction as the axis of rotation. Also, in the above-described embodiment, the substrates the robot 1 transfers may be LCD glass substrates or the like.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:
1. An industrial robot comprising:
    a first hand and a second hand, each of which is provided with a first hand portion comprising:
    one substrate-mounting portion to mount a sheet of substrate and a second hand portion having multiple substrate-mounting portions arranged to overlap with each other in the up-down direction at a predetermined pitch;
    a first arm which said first hand portion and said second hand portion of said first hand are rotatably joined to a front end thereof;
    a second arm which said first hand portion and said second hand portion of said second hand are rotatably joined to a front end thereof;
    an arm support portion to which a base end of said first arm and a base end of said second arm are rotatably joined;
    a column portion for holding said arm support portion movable in an up-down direction;
    a first hand portion-rotating mechanism for rotating said first hand portion of said first hand with respect to said first arm;
    a second hand portion-rotating mechanism structured to rotate said second hand portion of said first hand with respect to said first arm;

a third hand portion-rotating mechanism structured to rotate said first hand portion of said second hand with respect to said second arm;
a fourth hand portion-rotating mechanism structured to rotate said second hand portion of said second hand with respect to said second arm;
a first arm-rotating mechanism structured to rotate said first arm with respect to said arm support portion;
a second arm-rotating mechanism structured to rotate said second arm with respect to said arm support portion; and
wherein said first hand portion and said second hand portion of said first hand are arranged such that they overlap with each other in the up-down direction and a center of rotation of said first hand portion of said first hand aligns with a center of rotation of said second hand portion of said first hand;
said first hand portion and said second hand portion of said second hand are arranged such that they overlap with each other in the up-down direction and a center of rotation of said first hand portion of said second hand aligns with a center of rotation of said second hand portion of said second hand;
said first arm is attached to a top surface of said arm support portion;
said second arm is attached to a bottom surface of said arm support portion;
said first arm and said second arm are arranged such that a center of rotation of said first arm aligns with the center of rotation of said second arm;
wherein the first hand portion-rotating mechanism comprises a first hand portion-driving motor;
the second hand portion-rotating mechanism comprises a second hand portion-driving motor;
the first hand portion-rotating driving motor and the second hand portion-rotating driving motor are arranged inside the first arm;
the third hand portion-rotating mechanism comprises a third hand portion-driving motor;
the fourth hand portion-rotating mechanism comprises a fourth hand portion-driving motor;
the third hand portion-rotating driving motor and the fourth hand portion-rotating driving motor are arranged inside the second arm;
in a direction perpendicular to the up-down direction, a center of a connecting portion of the arm support portion is disposed to a first side of a center of the column portion; and
when the first arm, the first hand portion, and the second hand portion are in a retracted position, the center of rotation of the first hand portion and the center of rotation of the second hand portion are disposed to a second side of the center of the column portion in the direction perpendicular to the up-down direction.

2. The industrial robot as set forth in claim 1 wherein
the first hand portion-rotating mechanism comprises a first hand portion-driving motor;
the second hand portion-rotating mechanism comprises a second hand portion-driving motor;
the first hand portion-rotating driving motor and the second hand portion-rotating driving motor are arranged inside the arm support portion.

3. The industrial robot as set forth in claim 1 wherein
the first hand portion-rotating mechanism comprises a first hand portion-driving motor;
the second hand portion-rotating mechanism comprises a second hand portion-driving motor;
the first hand portion-rotating driving motor and the second hand portion-rotating driving motor are arranged inside the arm support portion.

4. The industrial robot as set forth in claim 1 wherein said pre-processed substrates are mounted on said first hand portion and said second hand portion of said first hand, and the processed substrates are mounted on said first hand portion and said second hand portion of said second hand.

5. The industrial robot as set forth in claim 4 wherein said process is a cleaning process which cleans said substrates.

6. The industrial robot as set forth in claim 1 further comprising a horizontally-moving mechanism for moving said column portion in a horizontal direction.

7. The industrial robot as set forth in claim 6 wherein
said arm support portion extends, when viewed from a vertical direction, from said column portion in a direction inclined with respect to a direction orthogonal to a moving direction of said column portion moved by said horizontally-moving mechanism.

8. The industrial robot as set forth in claim 1 wherein
the first hand portion-rotating mechanism comprises a first pulley fixed to the output shaft of the first hand portion-driving motor;
the second hand portion-rotating mechanism comprises a second pulley fixed to the output shaft of the second hand portion-driving motor;
the third hand portion-rotating mechanism comprises a third pulley fixed to the output shaft of the third hand portion-driving motor;
the fourth hand portion-rotating mechanism comprises a fourth pulley fixed to the output shaft of the fourth hand portion-driving motor;
wherein the first pulley is positioned above the second pulley, and the third pulley is positioned below the forth pulley.

* * * * *